United States Patent
Goto et al.

(10) Patent No.: US 11,811,368 B2
(45) Date of Patent: Nov. 7, 2023

(54) POWER AMPLIFIER CIRCUIT

(71) Applicant: Murata Manufacturing Co., Ltd., Kyoto (JP)

(72) Inventors: Satoshi Goto, Kyoto (JP); Tomoaki Sato, Kyoto (JP); Hisanori Namie, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 381 days.

(21) Appl. No.: 17/230,342

(22) Filed: Apr. 14, 2021

(65) Prior Publication Data
US 2021/0328558 A1 Oct. 21, 2021

(30) Foreign Application Priority Data
Apr. 15, 2020 (JP) .................. 2020-073066

(51) Int. Cl.
| | |
|---|---|
| H03F 1/02 | (2006.01) |
| H03F 1/56 | (2006.01) |
| H03F 3/72 | (2006.01) |
| H03F 3/195 | (2006.01) |
| H03F 3/24 | (2006.01) |

(52) U.S. Cl.
CPC ............ *H03F 1/565* (2013.01); *H03F 3/195* (2013.01); *H03F 3/245* (2013.01); *H03F 3/72* (2013.01); *H03F 2200/318* (2013.01); *H03F 2200/451* (2013.01)

(58) Field of Classification Search
CPC ...................................... H03F 1/02; H03F 1/07
USPC ....................................... 330/124 R, 295, 51
See application file for complete search history.

(56) References Cited

U.S. PATENT DOCUMENTS

| | | | |
|---|---|---|---|
| 8,710,927 B2* | 4/2014 | Kamitani | H03F 3/245 330/51 |
| 8,779,856 B2* | 7/2014 | Wilson | H03F 1/0288 330/124 R |
| 8,884,692 B2* | 11/2014 | Lee | H03F 3/602 330/51 |
| 9,590,569 B2 | 3/2017 | Thompson et al. | |
| 2014/0111275 A1* | 4/2014 | Khlat | H03F 3/20 330/124 R |
| 2016/0028353 A1 | 1/2016 | Thompson et al. | |

* cited by examiner

*Primary Examiner* — Henry Choe
(74) *Attorney, Agent, or Firm* — Pearne & Gordon LLP (57) ABSTRACT

A power amplifier circuit includes a first amplification path including a first power amplifier, a second amplification path including a second power amplifier, a first switching circuit configured to electrically connect either the first amplification path or the second amplification path and a first output terminal to each other, a second switching circuit configured to electrically connect an input terminal and any one of a plurality of second output terminals to each other, and a matching circuit configured to electrically connect the first output terminal and the input terminal to each other and achieve impedance matching between the first output terminal and the input terminal.

19 Claims, 4 Drawing Sheets

POWER AMPLIFIER CIRCUIT

CROSS REFERENCE TO RELATED APPLICATION

This application claims priority from Japanese Patent Application No. 2020-073066 filed on Apr. 15, 2020. The content of this application is incorporated herein by reference in its entirety.

BACKGROUND OF THE DISCLOSURE

Field of the Disclosure

The present disclosure relates to a power amplifier circuit.

Description of the Related Art

Power amplifier circuits that amplify radio-frequency (RF) signals are used in communication using mobile terminals, such as mobile phones. There is a power amplifier circuit that switches, for the purpose of increasing efficiency, between a low power mode in which low power amplification is performed and a high power mode in which high power amplification is performed. Switching between the modes is performed by a switch. United States Patent Application Publication No. 2016/0028353 discloses a configuration including a switch for switching between paths in accordance with a mode and a switch for switching between paths in accordance with a frequency band that are integrated together.

BRIEF SUMMARY OF THE DISCLOSURE

In a case where a mode selection switch for performing switching in accordance with a mode and a band selection switch for performing switching in accordance with a frequency band are integrated together as in United States Patent Application Publication No. 2016/0028353, matching elements for the respective modes are provided between the mode selection switch and power amplifiers. Furthermore, in a case where optimum matching is to be achieved in each of the bands, matching circuits for the respective bands are provided on the output side of the band selection switch. These matching circuits result in an increase in circuit area.

Accordingly, it is an object of the present disclosure to provide a power amplifier circuit that enables appropriate matching while suppressing an increase in circuit area.

According to preferred embodiments of the present disclosure, a power amplifier circuit includes a first amplification path including one or more first power amplifiers configured to amplify an input signal to generate a first signal when in a first power mode; a second amplification path including one or more second power amplifiers configured to amplify the input signal to generate a second signal when in a second power mode; a first switching circuit including a plurality of first input terminals and a first output terminal, one of the plurality of first input terminals being connected to the first amplification path, another one of the plurality of first input terminals being connected to the second amplification path, the first switching circuit being configured to electrically connect either the first amplification path or the second amplification path and the first output terminal to each other in response to a first control signal indicating either the first power mode or the second power mode; a second switching circuit including a second input terminal and a plurality of second output terminals and configured to electrically connect the second input terminal and any one of the plurality of second output terminals to each other in response to a second control signal; and a matching circuit configured to electrically connect the first output terminal and the second input terminal to each other and achieve impedance matching between the first output terminal and the second input terminal.

According to preferred embodiments of the present disclosure, a power amplifier circuit includes a first amplification path including one or more first power amplifiers configured to amplify an input signal to generate a first signal when in a first power mode; a second amplification path including one or more second power amplifiers configured to amplify the input signal to generate a second signal when in a second power mode; a first switching circuit including a first terminal and a second terminal, the first terminal being connected to the first amplification path, the second terminal being connected to the second amplification path, the first switching circuit being configured not to electrically connect the first terminal and the second terminal to each other when in the first power mode and to electrically connect the first terminal and the second terminal to each other when in the second power mode in response to a first control signal indicating either the first power mode or the second power mode; a second switching circuit including an input terminal and a plurality of output terminals and configured to electrically connect the input terminal and any one of the plurality of output terminals to each other in response to a second control signal; and a first matching circuit configured to electrically connect the second terminal and the input terminal to each other and achieve impedance matching between the second terminal and the input terminal. The first amplification path includes a second matching circuit disposed between the one or more first power amplifiers and the first switching circuit. The second amplification path includes a third matching circuit disposed between the one or more second power amplifiers and the first switching circuit.

According to the preferred embodiments of the present disclosure, it is possible to provide a power amplifier circuit that enables appropriate matching while suppressing an increase in circuit area.

Other features, elements, characteristics and advantages of the present disclosure will become more apparent from the following detailed description of preferred embodiments of the present disclosure with reference to the attached drawings.

DETAILED DESCRIPTION OF THE DISCLOSURE

Figure 1:
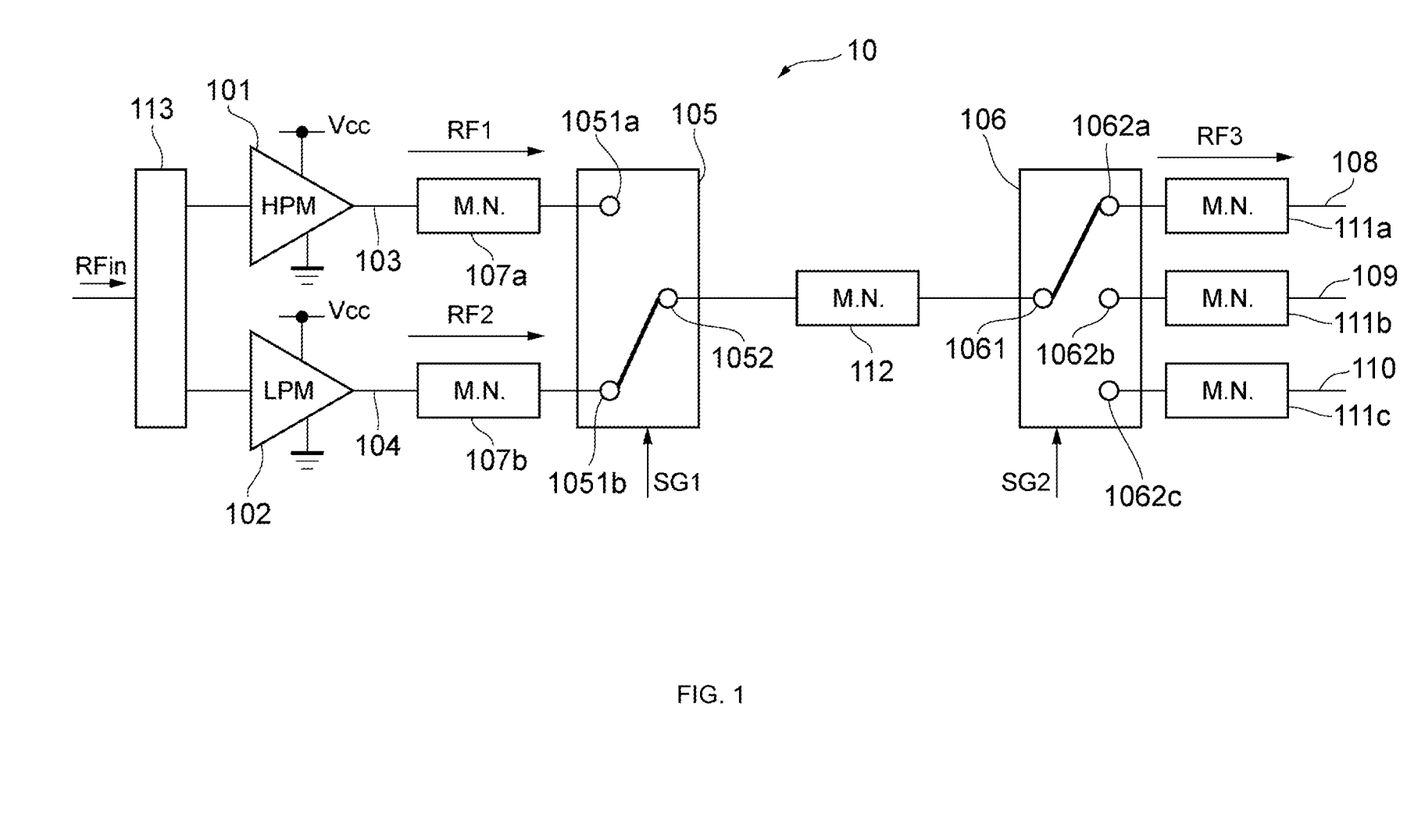
FIG. 1 is a circuit diagram illustrating an example of a power amplifier circuit according to a first embodiment.

Hereinafter, embodiments of the present disclosure will be described in detail with reference to the attached drawings. The same or substantially the same elements will be A first embodiment will be described with reference to FIG. 1. FIG. 1 illustrates a circuit diagram of a power amplifier circuit 10 according to the first embodiment. The power amplifier circuit 10 includes power amplifiers 101 and 102, amplification paths 103 and 104, switching circuits 105 and 106, matching circuits 107a and 107b, output paths 108, 109, and 110, matching circuits 111a, 111b, and 111c, a matching circuit 112, and a path selecting circuit 113.

The power amplifier 101 has an input connected to the path selecting circuit 113 and an output connected to the matching circuit 107a. A power supply voltage Vcc is supplied to the power amplifier 101. The power amplifier 101 amplifies an input signal RFin, which is inputted thereto through the path selecting circuit 113, and outputs an amplified signal RF1 (first signal).

The power amplifier 102 has an input connected to the path selecting circuit 113 and an output connected to the matching circuit 107b. The power supply voltage Vcc is supplied to the power amplifier 102. The power amplifier 102 amplifies the input signal RFin, which is inputted thereto through the path selecting circuit 113, and outputs an amplified signal RF2 (second signal).

The power amplifiers 101 and 102 each include, for example, a transistor such a heterojunction bipolar transistor (HBT).

The amplification path 103 (first amplification path) is a signal path through which the amplified signal RF1 propagates. The amplification path 104 (second amplification path) is a signal path through which the amplified signal RF2 propagates. The power amplifier 101 is included in the amplification path 103. The power amplifier 102 is included in the amplification path 104.

The switching circuit 105 includes input terminals 1051a and 1051b and an output terminal 1052. The input terminal 1051a is connected to the matching circuit 107a. The input terminal 1051b is connected to the matching circuit 107b. The output terminal 1052 is connected to the matching circuit 112. The matching circuits 107a and 107b and the matching circuit 112 will be described below.

A control signal SG1 (first control signal) is inputted to the switching circuit 105. The switching circuit 105 is a switch that switches, in response to the control signal SG1, between the connection between the input terminal 1051a and the output terminal 1052 and the connection between the input terminal 1051b and the output terminal 1052, thereby electrically connecting the amplification path 103 or the amplification path 104 to the output terminal 1052.

The switching circuit 106 includes an input terminal 1061, an output terminal 1062a (first output path), an output terminal 1062b (second output path), and an output terminal 1062c. The input terminal 1061 is connected to the matching circuit 112. The output terminal 1062a is connected to the matching circuit 111a. The output terminal 1062b is connected to the matching circuit 111b. The output terminal 1062c is connected to the matching circuit 111c. The matching circuits 111a, 111b, and 111c will be described below. In this embodiment, three output terminals are provided. Alternatively, two output terminals or four or more terminals may be provided. In this embodiment, one input terminal is provided. Alternatively, a plurality of input terminals may be provided.

A control signal SG2 (second control signal) is inputted to the switching circuit 106. The switching circuit 106 is a switch that electrically connects the input terminal 1061 and the output terminal 1061a, 1061b, or 1061c to each other in response to the control signal SG2.

The matching circuit 107a (second matching circuit) is disposed between the power amplifier 101 and the switching circuit 105. The matching circuit 107a is configured to achieve impedance matching between the output of the power amplifier 101 and the input terminal 1051a. The matching circuit 107a serves as a part of a matching circuit for achieving impedance matching between the output of the power amplifier 101 and the input terminal 1061. The matching circuit 107a is included in the amplification path 103.

The matching circuit 107b (third matching circuit) is disposed between the power amplifier 102 and the switching circuit 105. The matching circuit 107b is configured to achieve impedance matching between the output of the power amplifier 102 and the input terminal 1051b. The matching circuit 107b serves as a part of a matching circuit for achieving impedance matching between the output of the power amplifier 102 and the input terminal 1061. The matching circuit 107b is included in the amplification path 104.

The output path 108 is connected to the output terminal 1062a. The output path 109 is connected to the output terminal 1062b. The output path 110 is connected to the output terminal 1062c. An output signal RF3 is outputted to the outside of the power amplifier circuit 10 through the output path 108, 109, or 110.

The matching circuit 111a (fourth matching circuit) is disposed on the output path 108. The matching circuit 111a is connected to the output terminal 1062a. The matching circuit 111b (fifth matching circuit) is disposed on the output path 109. The matching circuit 111b is connected to the output terminal 1062b. The matching circuit 111c is disposed on the output path 110. The matching circuit 111c is connected to the output terminal 1062c.

The matching circuits 111a, 111b, and 111c are configured to achieve impedance matching between the output terminals 1062a, 1062b, and 1062c and the outside connected through the output paths 108, 109, and 110, respectively.

The matching circuit 112 (first matching circuit) electrically connects the output terminal 1052 (first output terminal) and the input terminal 1061 to each other. The matching circuit 112 is configured to achieve impedance matching between the output terminal 1052 and the input terminal 1061. The matching circuit 112 achieves impedance matching between the output of the power amplifier 101 or 102 and the input terminal 1061 in cooperation with the matching circuit 107a or the matching circuit 107b.

The matching circuit 112 may include a matching element that is to be used in common in the impedance matching by the matching circuit 107a and the impedance matching by the matching circuit 107b. For example, it is assumed that, in the impedance matching by the matching circuit 107a, an inductance element is connected to the amplification path 103 and is used to adjust the impedance. This inductance element may also be used in the impedance matching by the matching circuit 107b. In this case, an inductance element corresponding to this inductance element may be provided in the matching circuit 112, not in the matching circuit 107a or the matching circuit 107b, and thus the inductance element can be shared as a matching element. The matching element to be shared may be a capacitor instead of an inductance element. As a result of sharing the matching element, the circuit area to be used for matching can be reduced.

The matching circuit 112 may include a matching element that is to be used in common in the impedance matching by the matching circuit 111a, the impedance matching by the matching circuit 111b, and the impedance matching by the matching circuit 111c. Accordingly, the matching element can be shared and the circuit area can be reduced as in the foregoing example.

The path selecting circuit 113 is connected to the power amplifier 101 and the power amplifier 102. The path selecting circuit 113 selectively outputs, to the power amplifier 101 or the power amplifier 102, the input signal RFin inputted to the one end thereof. The path selecting circuit 113 is, for example, a circuit that selects a path using a switch. The power amplifier 101 and the power amplifier 102 are each disclosed to have a single-stage configuration, but may have a multi-stage configuration that is not illustrated.

An amplification operation of the power amplifier circuit 10 will be described. The power amplifier circuit 10 has a high power mode (HPM) in which high power amplification is performed and a low power mode (LPM) in which low power amplification is performed. The HPM is a first power mode. The LPM is a second power mode. Selection of the HPM or the LPM may be performed by a control circuit outside the power amplifier circuit 10. The switching circuit 105 (first switching circuit) functions as a mode selection switch that switches between connections in response to the control signal SG1 for switching between the HPM and the LPM.

The power amplifier circuit 10 selects the output path 108, 109, or 110 in accordance with the frequency band of the input signal RFin and outputs the output signal RF3. Selection of the frequency band is performed by a control circuit outside the power amplifier circuit 10. The switching circuit 106 functions as a band selection switch that switches between connections in response to the control signal SG2 for switching between frequency bands.

The input signal RFin is inputted to the path selecting circuit 113.

In the LPM, the path selecting circuit 113 outputs the input signal RFin to the power amplifier 102. The control signal SG1 for connecting the input terminal 1051b and the output terminal 1052 to each other is inputted to the switching circuit 105.

The power amplifier 102 amplifies the input signal RFin inputted thereto through the path selecting circuit 113 and outputs the amplified signal RF2. The amplified signal RF2 passes through the input terminal 1051b and is outputted from the output terminal 1052 to the matching circuit 112. The amplified signal RF2 passes through the matching circuit 112 and is inputted to the input terminal 1061.

For example, the control signal SG2 for connecting the input terminal 1061 and the output terminal 1062a to each other is inputted to the switching circuit 106 (second switching circuit) in accordance with a predetermined frequency band of the amplified signal RF2.

The amplified signal RF2 passes thorough the input terminal 1061 and is outputted as the output signal RF3 from the output terminal 1062a.

In the HPM, the path selecting circuit 113 outputs the input signal RFin to the power amplifier 101. The control signal SG1 for connecting the input terminal 1051a and the output terminal 1052 to each other is inputted to the switching circuit 105.

The power amplifier 101 amplifies the input signal RFin inputted thereto through the path selecting circuit 113 and outputs the amplified signal RF1. The amplified signal RF1 has a higher power than the amplified signal RF2.

The amplified signal RF1 passes through the switching circuit 106 and is outputted as the output signal RF3, like the amplified signal RF2.

Figure 2:
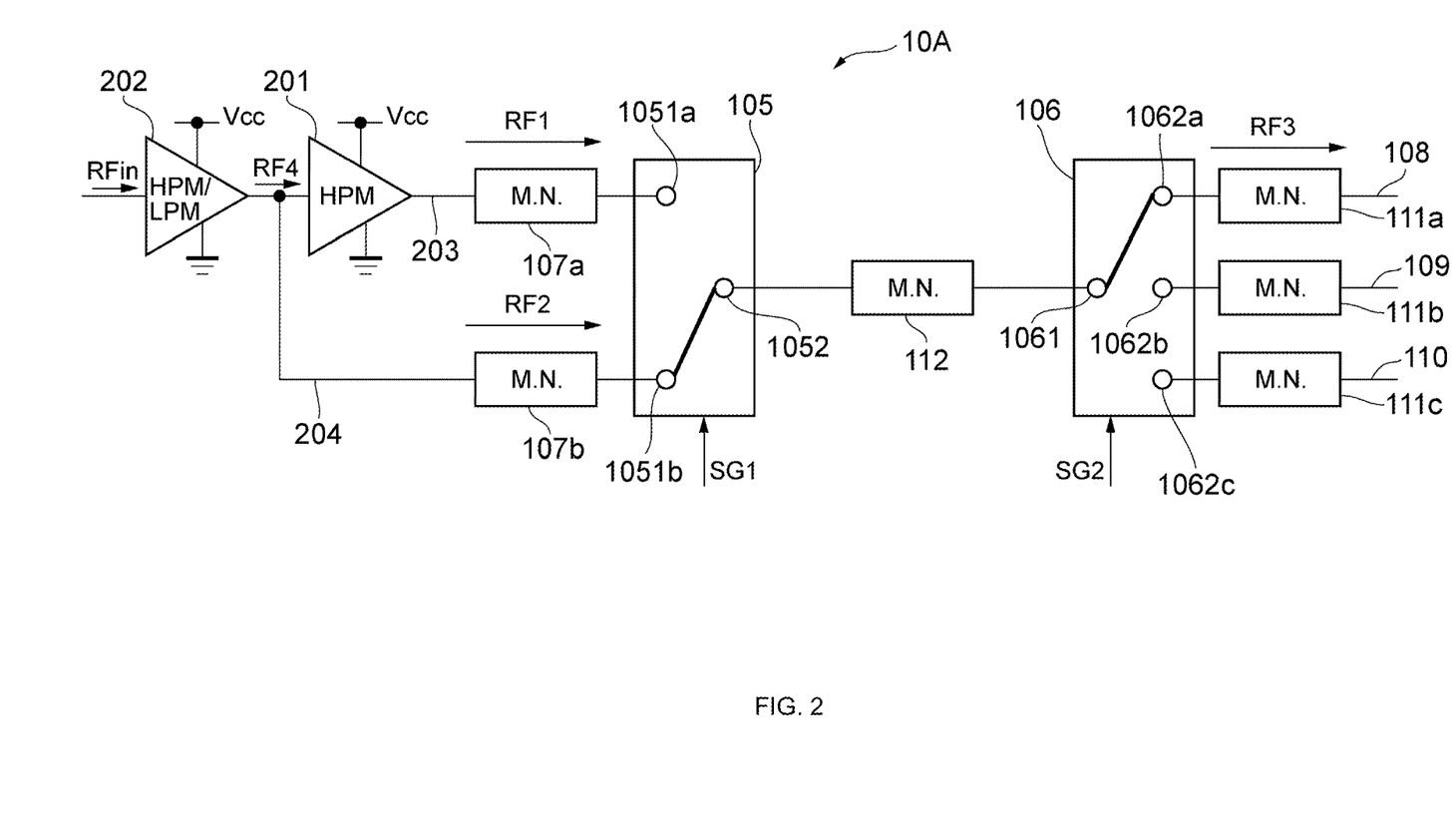
FIG. 2 is a circuit diagram illustrating an example of a power amplifier circuit according to a second embodiment.

A second embodiment will be described. In the second embodiment and the subsequent embodiments, the same features as those of the first embodiment will not be described, and only differences will be described. In particular, similar functions and effects of similar configurations will not be repeatedly described in each embodiment. A power amplifier circuit 10A according to the second embodiment will be described. FIG. 2 illustrates a circuit diagram of the power amplifier circuit 10A. The power amplifier circuit 10A includes power amplifiers 201 and 202, amplification paths 203 and 204, the switching circuits 105 and 106, the matching circuits 107a and 107b, the output paths 108, 109, and 110, the matching circuits 111a, 111b, and 111c, and the matching circuit 112.

The power amplifier 201 has an input connected to the output of the power amplifier 202 and the amplification path 203. The power amplifier 201 has an output connected to the matching circuit 107a. A power supply voltage Vcc is supplied to the power amplifier 201. In response to input of an amplified signal RF4 outputted from the power amplifier 202, the power amplifier 201 amplifies the amplified signal RF4 and outputs an amplified signal RF1.

The power amplifier 202 has the output connected to the power amplifier 201 and the matching circuit 107b. The power supply voltage Vcc is supplied to the power amplifier 202. In the HPM, the power amplifier 202 amplifies an input signal RFin and outputs the amplified signal to the power amplifier 201. In the LPM, the power amplifier 202 amplifies the input signal RFin and outputs an amplified signal RF2 to the input terminal 1051b.

The power amplifier 201 operates when in the HPM. The power amplifier 202 operates when in the LPM and when in the HPM. That is, the power amplifier 202 is a first-stage power amplifier, and the power amplifier 201 is a second-stage power amplifier.

The amplification path 203 is a signal path through which the amplified signal RF1 propagates. The amplification path 204 is a signal path through which the amplified signal RF2 propagates. The power amplifier 201 is included in the amplification path 203. The power amplifier 202 is included in the amplification path 204.

The matching circuit 107a is disposed between the power amplifier 201 and the switching circuit 105. The matching circuit 107a is configured to achieve impedance matching between the output of the power amplifier 201 and the input terminal 1051a. The matching circuit 107a serves as a part of a matching circuit for achieving impedance matching between the output of the power amplifier 201 and the input terminal 1061. The matching circuit 107a is included in the amplification path 203.

The matching circuit 107b is disposed between the output of the power amplifier 202 and the input terminal 1051b of the switching circuit 105. The matching circuit 107b is configured to achieve impedance matching between the output of the power amplifier 202 and the input terminal 1051b. The matching circuit 107b serves as a part of a matching circuit for achieving impedance matching between the output of the power amplifier 202 and the input terminal 1061. The matching circuit 107b is included in the amplification path 204.

In the power amplifier circuit 10A, switching between connections in the switching circuit 105 is performed in response to a control signal SG1, and thereby switching between the HPM and the LPM is performed.

Also, in the power amplifier circuit 10A, the matching circuit 112 is capable of sharing a matching element with the matching circuits 107a and 107b, and is also capable of sharing a matching element with the matching circuits 111a, 111b, and 111c. As a result of sharing the matching element, the circuit area to be used for matching can be reduced.

The switching circuit 105 and the switching circuit 106 may be disposed on or in a single integrated circuit (IC) chip. Alternatively, the switching circuit 105 and the switching circuit 106 may be disposed on or in IC chips different from each other and may be connected to each other via a wiring line.

Figure 3:
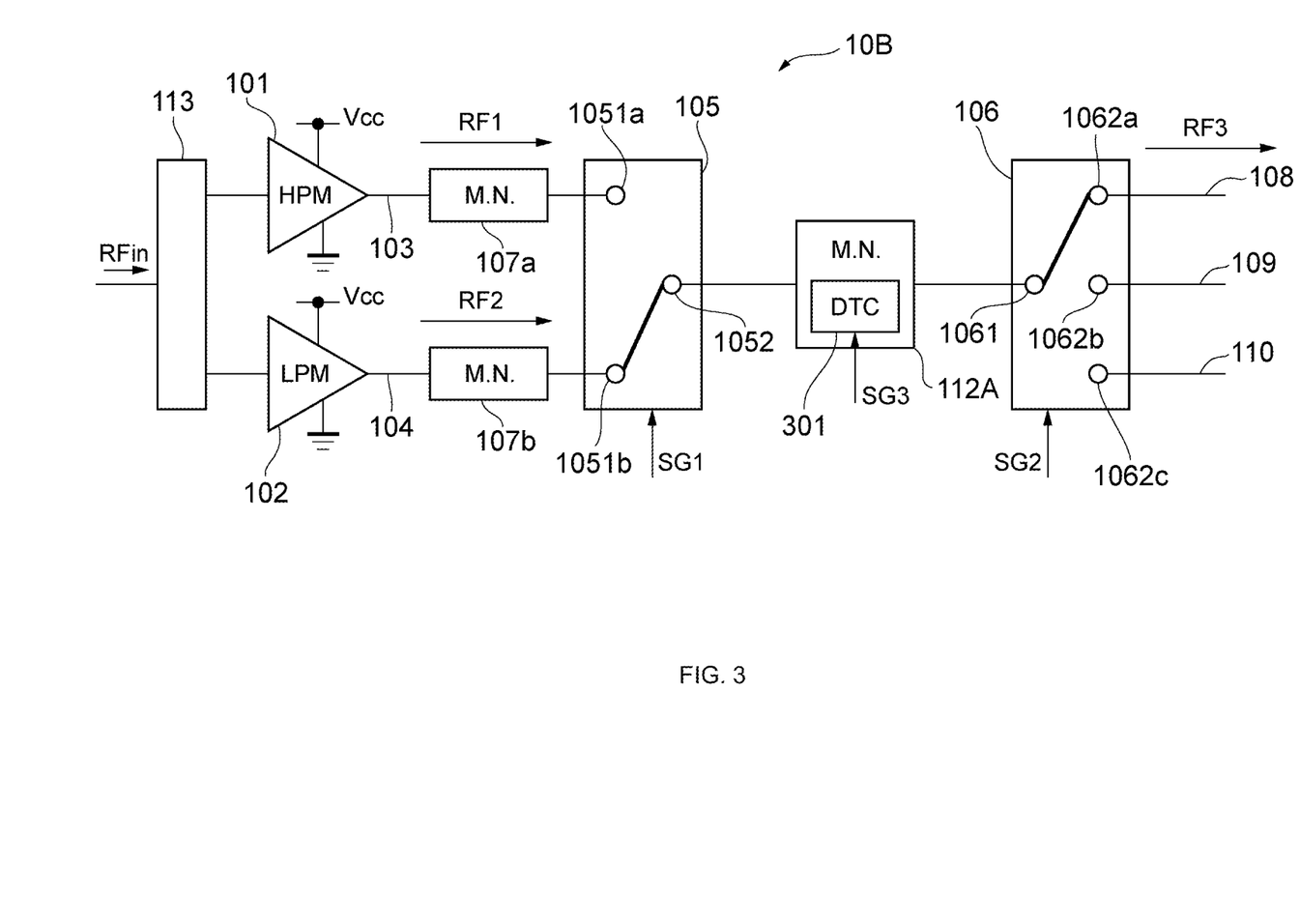
FIG. 3 is a circuit diagram illustrating an example of a power amplifier circuit according to a third embodiment.

A third embodiment will be described. FIG. 3 illustrates a circuit diagram of a power amplifier circuit 10B according to the third embodiment.

The power amplifier circuit 10B includes a variable matching circuit 112A. The power amplifier circuit 10B is different from the power amplifier circuits according to the first and second embodiments in not including the matching circuits 111a, 111b, and 111c.

The variable matching circuit 112A includes a variable capacitor (digital tunable capacitor (DTC)) 301 as an example of a variable element. The variable capacitor 301 is a capacitor whose capacitance value is changeable in response to a control signal SG3 inputted from the outside. Another type of variable element (a variable resistor, a variable phase shifter, or a variable inductor) may be used instead of the variable capacitor. The variable matching circuit 112A including the variable element is capable of adjusting characteristics associated with impedance matching.

In the power amplifier circuit 10B, the control signal SG3 is inputted to the variable capacitor 301 in accordance with a control signal SG2 for controlling the switching circuit 106, which is a band selection switch. The variable matching circuit 112A is configured to achieve impedance matching with the outside connected through the output path 108, 109, or 110 as a result of the capacitance value of the variable capacitor 301 being adjusted. In a case where the variable element is not an element that adjusts a capacitance value like the variable capacitor 301, the parameter of the variable element may be adjusted, and thereby characteristics associated with impedance matching can be adjusted.

In the power amplifier circuit 10B, unlike in the power amplifier circuit 10, it is not necessary to use the matching circuits 111a, 111b, and 111c, and thus the circuit area to be used for matching can be reduced. In addition, optimized matching makes it possible to optimize the impedance in each power mode, the HPM or the LPM, and to reduce current consumption in the power amplifier circuit 10B.

Figure 4:
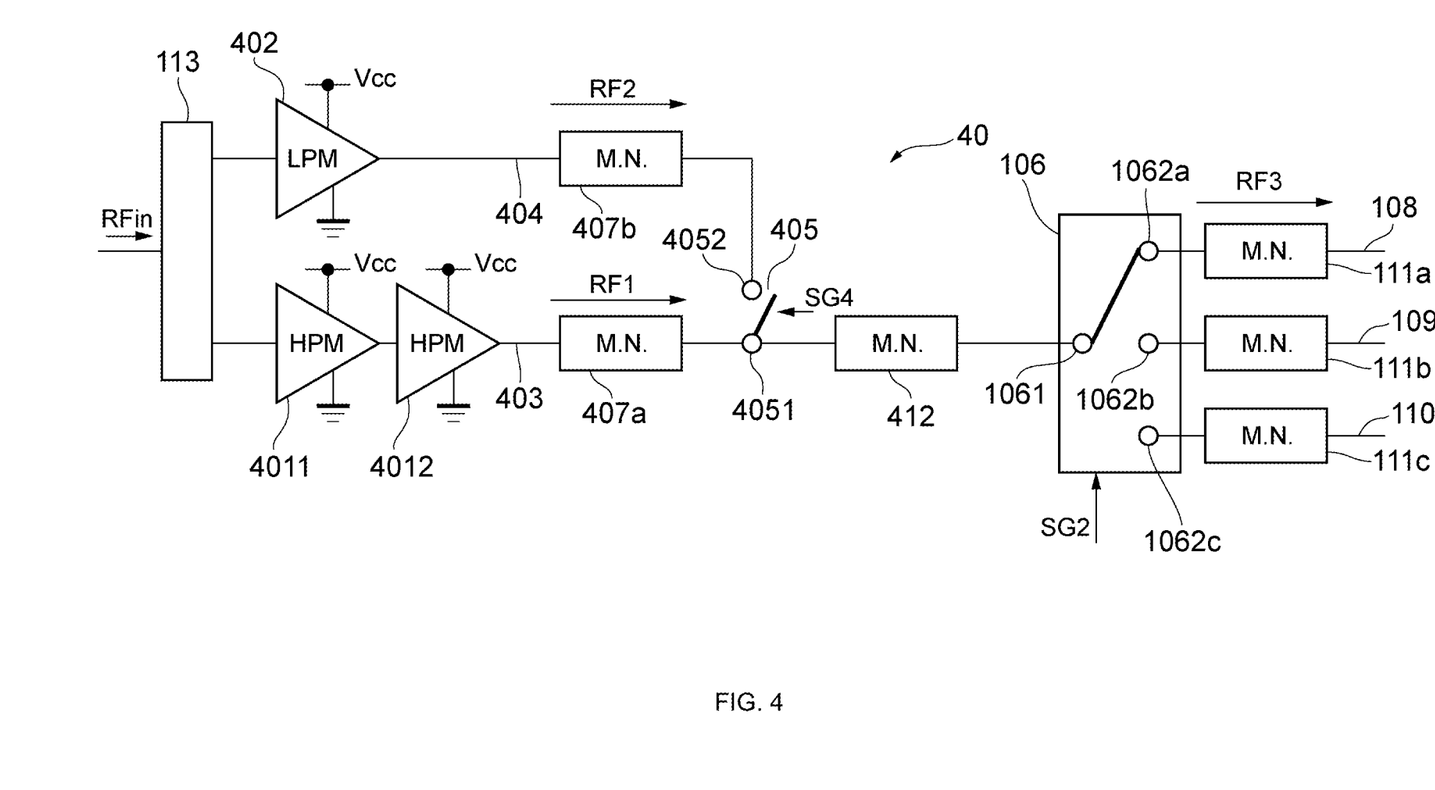
FIG. 4 is a circuit diagram illustrating an example of a power amplifier circuit according to a fourth embodiment.

A fourth embodiment will be described. FIG. 4 illustrates a circuit diagram of a power amplifier circuit 40 according to the fourth embodiment. The power amplifier circuit 40 includes power amplifiers 4011, 4012, and 402, amplification paths 403 and 404, switching circuits 405 and 106, matching circuits 407a and 407b, the output paths 108, 109, and 110, the matching circuits 111a, 111b, and 111c, a matching circuit 412, and the path selecting circuit 113.

The power amplifier 4011 has an input connected to the path selecting circuit 113. The power amplifier 4011 has an output connected to the input of the power amplifier 4012. The power amplifier 4012 has an output connected to a terminal 4051 of the switching circuit 405.

The power amplifier 402 has an input connected to the path selecting circuit 113. The power amplifier 402 has an output connected to a terminal 4052 of the switching circuit 405.

The power amplifiers 4011 and 4012 amplify an input signal RFin inputted to the power amplifier circuit 40 and output an amplified signal RF1. The power amplifier 402 amplifies the input signal RFin inputted to the power amplifier circuit 40 and outputs an amplified signal RF2.

The amplification path 403 is a signal path through which the amplified signal RF1 propagates. The amplification path 404 is a signal path through which the amplified signal RF2 propagates. The power amplifiers 4011 and 4012 are included in the amplification path 403. The power amplifier 402 is included in the amplification path 404.

The matching circuit 407a is disposed between the power amplifier 4012 and the switching circuit 405. The matching circuit 407a is configured to achieve impedance matching between the output of the power amplifier 4012 and the terminal 4051 of the switching circuit 405. The matching circuit 407a serves as a part of a matching circuit for achieving impedance matching between the output of the power amplifier 4012 and the input terminal 1061. The matching circuit 407a is included in the amplification path 403.

The matching circuit 407b is disposed between the output of the power amplifier 402 and the matching circuit 412, which will be described below. The matching circuit 407b is configured to achieve impedance matching between the output of the power amplifier 402 and the matching circuit 412. The matching circuit 407b serves as a part of a matching circuit for achieving impedance matching between the output of the power amplifier 402 and the input terminal 1061. The matching circuit 407b is included in the amplification path 404.

The switching circuit 405 is connected to the output of the power amplifier 4012 and the switching circuit 106 via the terminal 4051. The switching circuit 405 is also connected to the output of the power amplifier 402 via the terminal 4052. The switching circuit 405 is a switch that is turned on or off in response to a control signal SG4 inputted from the outside. The switching circuit 405 is in an on state when in the LPM and is in an off state when in the HPM.

The matching circuit 412 is disposed between a set of the switching circuit 405 and the power amplifier 402, and the switching circuit 106. The matching circuit 412 electrically connects the amplification path 404 and the input terminal 1061 to each other. The matching circuit 412 achieves impedance matching between the amplification path 403 and the input terminal 1061 when the switching circuit 405 is turned off. The matching circuit 412 achieves impedance matching between the amplification path 404 and the input terminal 1061 when the switching circuit 405 is turned on.

When the switching circuit 405 is in an on state, the amplified signal RF2 propagates through the matching circuit 412, and the power amplifier circuit 40 operates in the LPM. When the switching circuit 405 is in an off state, the amplified signal RF1 propagates through the matching circuit 412, and the power amplifier circuit 40 operates in the HPM.

Also, in the power amplifier circuit 40, the matching circuit 412 is capable of sharing a matching element with the matching circuits 407a and 407b, and is also capable of sharing a matching element with the matching circuits 111a, 111b, and 111c. As a result of sharing the matching element, the circuit area to be used for matching can be reduced.

In the power amplifier circuit 40, as in the power amplifier circuit 10B, the matching circuit 412 may include a variable capacitor or may include a variable element (a variable resistor, a variable phase shifter, a variable inductor, or the like). Accordingly, as in the power amplifier circuit 10B, impedance matching suitable for the HPM and the LPM can be achieved, and current consumption can be reduced.

Exemplary embodiments of the present disclosure have been described above. The power amplifier circuit 10 according to the first embodiment includes the amplification path 103 including one or more power amplifiers 101 configured to generate the amplified signal RF1 from the input signal RFin when in the HPM, and the amplification path 104 including one or more power amplifiers 102 configured to generate the amplified signal RF2 from the input signal RFin when in the LPM.

The power amplifier circuit 10 includes the switching circuit 105 including the input terminals 1051a and 1051b and the output terminal 1052. The input terminal 1051a is connected to the amplification path 103, and the input terminal 1051b is connected to the amplification path 104. The switching circuit 105 is configured to electrically connect either the amplification path 103 or the amplification path 104 and the output terminal 1052 to each other in response to the control signal SG1 indicating either the HPM or the LPM.

The power amplifier circuit 10 includes the switching circuit 106 including the input terminal 1061 and the output terminals 1062a, 1062b, and 1062c and configured to electrically connect, in response to the control signal SG2, the input terminal 1061 and any one of the output terminals 1062a, 1062b, and 1062c to each other.

The power amplifier circuit 10 includes the matching circuit 112 configured to electrically connect the output terminal 1052 and the input terminal 1061 to each other and achieve impedance matching between the output terminal 1052 and the input terminal 1061.

In this configuration of the power amplifier circuit 10 in which a plurality of paths connected to the input side of the switching circuit 105 or the output side of the switching circuit 106 each include a matching circuit, a matching element included in the matching circuit 112 can be shared between these matching circuits. The sharing of the matching element makes it possible to reduce the circuit area to be used for matching. Thus, it is possible to achieve appropriate matching while suppressing an increase in the circuit area.

In the power amplifier circuit 10, the amplification path 103 includes the matching circuit 107a disposed between the power amplifier 101 and the switching circuit 105, and the amplification path 104 includes the matching circuit 107b disposed between the power amplifier 102 and the switching circuit 105. The matching circuit 112 includes the matching element that is shared between the matching circuits 107a and 107b, and thus it is possible to achieve appropriate matching while suppressing an increase in the circuit area.

The power amplifier circuit 10 further includes the output path 108 including the matching circuit 111a and connected to the output terminal 1062a, and the output path 109 including the matching circuit 111b and connected to the output terminal 1062b. The matching circuit 112 includes the matching element that is shared between the matching circuits 111a and 111b, and thus it is possible to achieve appropriate matching while suppressing an increase in the circuit area.

The power amplifier circuit 10B according to the third embodiment includes the variable matching circuit 112A, which is a variable matching circuit whose characteristic is adjustable. In the power amplifier circuit 10B, the variable matching circuit 112A includes the variable capacitor 301. In the power amplifier circuit 10B, the adjustable capacitance value of the variable capacitor 301 enables use of the integrated matching element, which eliminates the necessity for using the matching circuits 111a, 111b, and 111c that are included in the power amplifier circuit 10, and thus the circuit area to be used for matching can be reduced. Furthermore, optimized impedance matching makes it possible to reduce current consumption in the power amplifier circuit 10B.

In the power amplifier circuit 10, the switching circuit 105 and the switching circuit 106 may be disposed on or in a single IC chip. Alternatively, in the power amplifier circuit 10, the switching circuit 105 and the switching circuit 106 may be disposed on or in IC chips different from each other.

In the power amplifier circuit 10, the switching circuit 105 electrically connects, in response to the control signal SG2 based on the frequency band of an input signal, the input terminal 1061 and any one of the output terminals 1062a, 1062b, and 1062c to each other. Accordingly, the power amplifier circuit 10 is capable of switching the band and amplifying power.

The power amplifier circuit 10 further includes the path selecting circuit 113 configured to receive the input signal RFin and output the input signal RFin to the amplification path 103 or the amplification path 104 to select the HPM or the LPM. The mode of the power amplifier circuit 10 selected by the path selecting circuit 113 is not necessarily limited to the HPM or the LPM.

The power amplifier circuit 40 according to the fourth embodiment includes the amplification path 403 including one or more power amplifiers 4011 and 4012 configured to generate the amplified signal RF1 from the input signal RFin when in the HPM, and the amplification path 404 including one or more power amplifiers 402 configured to generate the amplified signal RF2 from the input signal RFin when in the LPM.

The power amplifier circuit 40 includes the switching circuit 405 including the terminal 4051 and the terminal 4052. The terminal 4051 is connected to the amplification path 403, and the terminal 4052 is connected to the amplification path 404. The switching circuit 405 is configured to be in an off state when in the HPM and be in an on state when in the LPM in response to the control signal SG4 indicating either the HPM or the LPM.

The power amplifier circuit 40 includes the switching circuit 106 including the input terminal 1061 and the output terminals 1062a, 1062b, and 1062c and configured to electrically connect, in response to the control signal SG2, the input terminal 1061 and any one of the output terminals 1062a, 1062b, and 1062c to each other.

The power amplifier circuit 40 includes the matching circuit 412 configured to electrically connect the terminal 4051 and the input terminal 1061 to each other and achieve impedance matching between the terminal 4051 and the input terminal 1061.

In the power amplifier circuit 40, the amplification path 403 includes the matching circuit 407a disposed between the power amplifier 4012 and the switching circuit 405, and the amplification path 404 includes the matching circuit 407b disposed between the power amplifier 402 and the switching circuit 405.

Also, in the power amplifier circuit 40, the matching circuit 412 includes a matching element that is shared between the individual matching circuits, and thus the circuit area to be used for matching can be reduced. Thus, it is possible to achieve appropriate matching while suppressing an increase in the circuit area. In the power amplifier circuit 40, the matching circuit 412 may include a variable capacitor or a variable element (a variable resistor, a variable phase shifter, a variable inductor, or the like) as in the power amplifier circuit 10B.

The individual embodiments described above are given for facilitating the understanding of the present disclosure and are not for interpreting the present disclosure in a limited manner. The present disclosure can be modified or improved without deviating from the gist thereof, and includes the equivalents thereof. That is, an embodiment obtained by appropriately changing the design of one of the embodiments by a person skilled in the art is included in the scope of the present disclosure as long as the embodiment has a feature of the present disclosure. For example, the individual elements of the individual embodiments, and the dispositions, conditions, and so forth thereof are not limited to those described as an example and can be changed as appropriate. Each of the embodiments is merely an example. Obviously, elements illustrated in different embodiments can be partially replaced or combined, and the replacement or combination is also included in the scope of the present disclosure as long as the replacement or combination has a feature of the present disclosure. The scope of the disclosure is to be determined solely by the following claims.

What is claimed is:

1. A power amplifier circuit comprising:
a first amplification path including at least one first power amplifier configured to amplify an input signal to generate a first signal when in a first power mode;
a second amplification path including at least one second power amplifier configured to amplify the input signal to generate a second signal when in a second power mode;
a first switching circuit including a plurality of first input terminals and a first output terminal, one of the plurality of the first input terminals being connected to the first amplification path, another one of the plurality of the first input terminals being connected to the second amplification path, the first switching circuit being configured to electrically connect either the first amplification path or the second amplification path and the first output terminal to each other in response to a first control signal indicating either the first power mode or the second power mode;
a second switching circuit including a second input terminal and a plurality of second output terminals and configured to electrically connect the second input terminal and any one of the plurality of the second output terminals to each other in response to a second control signal; and
a first matching circuit configured to electrically connect the first output terminal and the second input terminal to each other and achieve impedance matching between the first output terminal and the second input terminal.

2. The power amplifier circuit according to claim 1, wherein
the first amplification path includes a second matching circuit disposed between the at least one first power amplifier and the first switching circuit, and
the second amplification path includes a third matching circuit disposed between the at least one second power amplifier and the first switching circuit.

3. The power amplifier circuit according to claim 2, wherein the first matching circuit comprises a matching element configured to be shared in the impedance matching with the second matching circuit and the third matching circuit.

4. The power amplifier circuit according to claim 3, wherein the matching element is one of an inductance or a capacitor connected to the first amplification path.

5. The power amplifier circuit according to claim 1, further comprising:
a first output path including a fourth matching circuit and connected to one of the plurality of the second output terminals; and
a second output path including a fifth matching circuit and connected to another one of the plurality of the second output terminals.

6. The power amplifier circuit according to claim 5, wherein the first matching circuit comprises a matching element configured to be shared in the impedance matching with the fourth matching circuit and the fifth matching circuit.

7. The power amplifier circuit according to claim 6, wherein the matching element is one of an inductance or a capacitor connected to the first amplification path.

8. The power amplifier circuit according to claim 1, wherein the first matching circuit comprises a variable matching circuit with an adjustable characteristic.

9. The power amplifier circuit according to claim 2, wherein the first matching circuit comprises a variable matching circuit with an adjustable characteristic.

10. The power amplifier circuit according to claim 5, wherein the first matching circuit comprises a variable matching circuit with an adjustable characteristic.

11. The power amplifier circuit according to claim 1, wherein the first switching circuit and the second switching circuit are disposed on or in a single integrated circuit chip.

12. The power amplifier circuit according to claim 2, wherein the first switching circuit and the second switching circuit are disposed on or in a single integrated circuit chip.

13. The power amplifier circuit according to claim 5, wherein the first switching circuit and the second switching circuit are disposed on or in a single integrated circuit chip.

14. The power amplifier circuit according to claim 1, wherein the first switching circuit is disposed on or in an integrated circuit chip and the second switching circuit is disposed on or in another integrated circuit chip.

15. The power amplifier circuit according to claim 2, wherein the first switching circuit is disposed on or in an integrated circuit chip and the second switching circuit is disposed on or in another integrated circuit chip.

16. The power amplifier circuit according to claim 5, wherein the first switching circuit is disposed on or in an integrated circuit chip and the second switching circuit is disposed on or in another integrated circuit chip.

17. The power amplifier circuit according to claim 1, wherein the second switching circuit is configured to electrically connect the second input terminal and any one of the plurality of the second output terminals to each other in response to the second control signal, wherein the second control signal is based on a frequency band of the input signal.

18. The power amplifier circuit according to claim 2, wherein the second switching circuit is configured to electrically connect the second input terminal and any one of the plurality of the second output terminals to each other in response to the second control signal, wherein the second control signal is based on a frequency band of the input signal.

19. The power amplifier circuit according to claim 1, further comprising a path selecting circuit configured to receive the input signal and output the input signal to the first amplification path or the second amplification path to select the first power mode or the second power mode.

\* \* \* \* \*